US011894047B2

(12) United States Patent
Peng et al.

(10) Patent No.: US 11,894,047 B2
(45) Date of Patent: Feb. 6, 2024

(54) SENSE AMPLIFIER, MEMORY AND METHOD FOR CONTROLLING SENSE AMPLIFIER

(71) Applicants: ANHUI UNIVERSITY, Anhui (CN); CHANGXIN MEMORY TECHNOLOGIES, INC., Hefei (CN)

(72) Inventors: Chunyu Peng, Anhui (CN); Yangkuo Zhao, Anhui (CN); Wenjuan Lu, Anhui (CN); Xiulong Wu, Anhui (CN); Zhiting Lin, Anhui (CN); Junning Chen, Anhui (CN); Xin Li, Anhui (CN); Rumin Ji, Anhui (CN); Jun He, Hefei (CN); Zhan Ying, Anhui (CN)

(73) Assignees: CHANGXIN MEMORY TECHNOLOGIES, INC., Hefei (CN); ANHUI UNIVERSITY, Hefei (CN)

( * ) Notice: Subject to any disclaimer, the term of this patent is extended or adjusted under 35 U.S.C. 154(b) by 268 days.

(21) Appl. No.: 17/441,780

(22) PCT Filed: Dec. 25, 2020

(86) PCT No.: PCT/CN2020/139365
§ 371 (c)(1),
(2) Date: Sep. 22, 2021

(87) PCT Pub. No.: WO2022/021733
PCT Pub. Date: Feb. 3, 2022

(65) Prior Publication Data
US 2023/0058436 A1     Feb. 23, 2023

(30) Foreign Application Priority Data
Jul. 27, 2020 (CN) .......................... 202010733140.5

(51) Int. Cl.
*G11C 11/4091* (2006.01)

(52) U.S. Cl.
CPC .............................. *G11C 11/4091* (2013.01)

(58) Field of Classification Search
CPC ......... G11C 11/4091; G11C 7/06; G11C 7/12; G11C 11/4094; G11C 7/08; G11C 7/065
See application file for complete search history.

(56) References Cited

U.S. PATENT DOCUMENTS 7,266,030 B2    9/2007   Do et al.
9,627,011 B1 *   4/2017   Conte ................. H03F 3/45475
(Continued)

FOREIGN PATENT DOCUMENTS

CN       1767059 A      5/2006
CN     102385900 A      3/2012
(Continued)

OTHER PUBLICATIONS

International Search Report cited in PCT/CN2020/139365 dated Apr. 27, 2021, 11 pages.
(Continued)

*Primary Examiner* — Khamdan N. Alrobaie
(74) *Attorney, Agent, or Firm* — Cooper Legal Group, LLC

(57) ABSTRACT

The present disclosure provides a sense amplifier, a memory, and a method for controlling a sense amplifier, relating to the technical field of semiconductor memories. The sense amplifier comprises: an amplification module; and an offset voltage storage unit electrically connected to the amplification module; wherein, in an offset cancellation stage of the sense amplifier, the sense amplifier is configured to comprise a current mirror structure to store an offset voltage of the amplification module in an offset voltage storage unit. The present disclosure can realize the offset cancellation of the sense amplifier.

18 Claims, 11 Drawing Sheets

(56) References Cited

U.S. PATENT DOCUMENTS

| | | |
|---|---|---|
| 10,290,340 B1 | 5/2019 | Jung et al. |
| 10,692,565 B2 | 6/2020 | Kim et al. |
| 10,734,056 B2 | 8/2020 | Boujamaa et al. |
| 11,087,817 B2 | 8/2021 | Vimercati |
| 2004/0027892 A1 | 2/2004 | Sim |
| 2011/0051532 A1 | 3/2011 | Barth, Jr. et al. |
| 2011/0133809 A1* | 6/2011 | Goel ............ G11C 11/4091 327/307 |
| 2015/0016183 A1* | 1/2015 | Sinangil ............ G11C 7/065 365/205 |
| 2022/0013152 A1* | 1/2022 | Cao ............ G11C 7/12 |
| 2022/0028436 A1* | 1/2022 | Lu ............ G11C 7/12 |
| 2022/0029586 A1* | 1/2022 | Wu ............ G11C 7/12 |

FOREIGN PATENT DOCUMENTS

| | | |
|---|---|---|
| CN | 105070310 A | 11/2015 |
| CN | 205789124 U | 12/2016 |
| CN | 109448768 A | 3/2019 |
| CN | 110959176 A | 4/2020 |
| CN | 111081296 A | 4/2020 |
| CN | 111199756 A | 5/2020 |
| CN | 210575115 U | 5/2020 |
| CN | 111863050 A | 10/2020 |
| CN | 111863052 A | 10/2020 |
| CN | 111863053 A | 10/2020 |
| KR | 101704933 B1 | 2/2017 |

OTHER PUBLICATIONS

First Office Action cited in CN202010733140.5 dated Mar. 16, 2022, 17 pages.

Kim, et al., "Sensing Voltage Compensation Circuit for Low-Power DRAM Bit-Line Sense Amplifier", 2018 International Conference on Electronics, Information, and Communication (ICEIC), Apr. 5, 2018, 4 pages.

* cited by examiner

SENSE AMPLIFIER, MEMORY AND METHOD FOR CONTROLLING SENSE AMPLIFIER

CROSS-REFERENCE TO RELATED APPLICATIONS

The present application claims the priority to the Chinese patent application 202010733140.5, titled "SENSE AMPLIFIER, MEMORY AND METHOD FOR CONTROLLING THE SENSE AMPLIFIER", filed on Jul. 27, 2020, which is incorporated herein by reference in its entirety.

TECHNICAL FIELD

The present disclosure relates to the technical field of semiconductor memories, and in particular to a sense amplifier, a memory, and a method for controlling a sense amplifier.

BACKGROUND OF THE PRESENT INVENTION

With the popularization of electronic devices such as mobile phones, tablets, and personal computers, the semiconductor memory technology developed rapidly. For example, memories, such as DRAMs (Dynamic Random Access Memories) and SRAMs (Static Random-Access Memories), have been widely used in various electronic devices due to their advantages of high density, low power consumption, low price, etc.

As an important part of a semiconductor memory, a sense amplifier (SA for short) mainly functions to amplify small signals on a bit line to perform read or write operations.

With the continuous improvement of technologies, the size of semiconductor memories is continuously reduced. In this case, in a sense amplifier, the imbalanced voltage caused by the mismatch of the transistors becomes increasingly high, which will seriously affect the performance of the semiconductor memories.

It should be noted that the information disclosed in the background section is only provided to enhance the understanding of the background of the present disclosure, and therefore may include information that does not constitute the existing technologies known to a person of ordinary skill in the art.

SUMMARY OF THE PRESENT INVENTION

The purpose of the present disclosure is to provide a sense amplifier, a memory, and a method for controlling a sense amplifier, so as to at least to some extent prevent the performance of semiconductor memories from being affected by the mismatch of transistors in a sense amplifier.

According to a first aspect of the present disclosure, a sense amplifier is provided, comprising: an amplification module; and an offset voltage storage unit, electrically connected to the amplification module; wherein, in an offset cancellation stage of the sense amplifier, the sense amplifier is configured to comprise a current mirror structure to store an offset voltage of the amplification module in the offset voltage storage unit.

Optionally, the amplification module comprises: a first PMOS transistor; a second PMOS transistor, a source of the second PMOS transistor being connected to a source of the first PMOS transistor; a first NMOS transistor, a drain of the first NMOS transistor being connected to a drain of the first PMOS transistor and a first terminal of the offset voltage storage unit, and a gate of the first NMOS transistor being connected to a gate of the first PMOS transistor; and a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second terminal of the offset voltage storage unit; wherein, in the offset cancellation stage of the sense amplifier, the first PMOS transistor and the second PMOS transistor are configured as a current mirror, and the first NMOS transistor and the second NMOS transistor are both configured by using diode connection mode, to store the offset voltage of the amplification module in the offset voltage storage unit.

Optionally, the drain of the first PMOS transistor is connected to the drain of the first NMOS transistor at a first node, and the drain of the second PMOS transistor is connected to the drain of the second NMOS transistor at a second node; the sense amplifier further comprises: a first switch, a first terminal of the first switch being connected to the first node, and a second terminal of the first switch being connected to the gate of the first NMOS transistor; a second switch, a first terminal of the second switch being connected to the second node, and a second terminal of the second switch being connected to the gate of the second NMOS transistor; and a third switch, a first terminal of the third switch being connected to the gate of the first PMOS transistor, and a second terminal of the third switch being connected to the gate of the second PMOS transistor; wherein, in the offset cancellation stage of the sense amplifier, the first switch, the second switch and the third switch are all in a closed state.

Optionally, the sense amplifier further comprises: a pull-up unit, configured to control a connection state between the source of the first PMOS transistor and a power supply voltage in response to a pull-up control signal; and a pull-down unit, configured to control the grounding the source of the first NMOS transistor in response to a pull-down control signal; wherein, in the offset cancellation stage of the sense amplifier, the source of the first PMOS transistor is connected to the power supply voltage, and the source of the first NMOS transistor is grounded.

Optionally, the first switch further comprises a control terminal configured to control an on-off state of the first switch in response to a first control signal; the second switch further comprises a control terminal configured to control an on-off state of the second switch in response to a second control signal; and a third switch further comprises a control terminal configured to control an on-off state of the third switch in response to the second control signal.

Optionally, the sense amplifier further comprises: a fourth switch, a first terminal of the fourth switch being connected to the gate of the first NMOS transistor, and a second terminal of the fourth switch being connected to the second node; and a fifth switch, a first terminal of the fifth switch being connected to the gate of the second PMOS transistor, and a second terminal of the fifth switch being connected to the gate of the second NMOS transistor; wherein, in the offset cancellation stage of the sense amplifier, the fourth switch and the fifth switch are both open.

Optionally, the fourth switch further comprises a control terminal configured to control an on-off state of the fourth switch in response to a third control signal; and the fifth switch further comprises a control terminal configured to control an on-off state of the fifth switch in response to the third control signal.

Optionally, the sense amplifier further comprises: a sixth switch, a first terminal of the sixth switch being connected to a first bit line, and a second terminal of the sixth switch being connected to the first node; and a seventh switch, a first terminal of the seventh switch being connected to a second bit line, and a second terminal of the seventh switch being connected to the second node; wherein, in the offset cancellation stage of the sense amplifier, the sixth switch and the seventh switch are both open.

Optionally, the sixth switch further comprises a control terminal configured to control an on-off state of the sixth switch in response to a fourth control signal; and the seventh switch further comprises a control terminal configured to control an on-off state of the seventh switch in response to the fourth control signal.

Optionally, after the offset cancellation stage of the sense amplifier, a storage unit corresponding to the first bit line or a storage unit corresponding to the second bit line is turned on, the first switch is open, the second switch and the third switch are open, the source of the first PMOS transistor is disconnected from the power supply voltage, the source of the first NMOS transistor is disconnected from the ground, the fourth switch and the fifth switch are closed, and the sixth switch and the seventh switch are closed to input a voltage difference between the first bit line and the second bit line into the sense amplifier.

Optionally, in a case where the voltage difference between the first bit line and the second bit line is input to the sense amplifier, the source of the first PMOS transistor is connected to the power supply voltage, and the source of the first NMOS transistor is grounded to amplify the voltage difference.

Optionally, the sense amplifier further comprises: a pre-charge unit, configured to pre-charge the first bit line and the second bit line when the sense amplifier is in a pre-charge stage.

Optionally, the pre-charge stage and the offset cancellation stage are configured to be executed simultaneously.

According to a second aspect of the present disclosure, a memory is provided, comprising the sense amplifier described above.

According to a third aspect of the present disclosure, a method for controlling a sense amplifier is provided, the sense amplifier comprising an amplification module and an offset voltage storage unit, comprising: in an offset cancellation stage of the sense amplifier, configuring the sense amplifier to comprise a current mirror structure to control an offset voltage of the amplification module to be stored in the offset voltage storage unit, to realize offset compensation.

Optionally, the method for controlling a sense amplifier further comprises: in the voltage sensing stage of the sense amplifier, generating a voltage difference based on stored data read from a storage unit corresponding to a first bit line or a storage unit corresponding to a second bit line.

Optionally, the working stage of the sense amplifier further comprises a voltage difference amplification stage; wherein, the method for controlling a sense amplifier further comprises: in the voltage difference amplification stage of the sense amplifier, amplifying the voltage difference, and based on the offset voltage stored in the offset voltage storage unit, preventing the voltage difference due to inconsistency of at least two transistors in the amplification module from being erroneously amplified. The transistors in the sense amplifier at least comprise a first NMOS transistor, a second NMOS transistor, a first PMOS transistor, and a second PMOS transistor.

Optionally, the working stage of the sense amplifier further comprises a pre-charge stage; wherein, the method for controlling a sense amplifier further comprises: in a pre-charge stage of the sense amplifier, pre-charging the first bit line and the second bit line.

Optionally, the method for controlling a sense amplifier further comprises: when the sense amplifier is in the offset cancellation stage, controlling a pre-charge operation in the pre-charge stage to be performed.

In the technical solutions provided in some embodiments of the present disclosure, by configuring the offset voltage storage unit in the sense amplifier, in the offset cancellation stage of the sense amplifier, the offset voltage of the amplification module in the sense amplifier can be stored in the offset voltage storage unit. Therefore, when data on the bit line needs to be read, by the offset voltage stored in the offset voltage storage unit, the offset compensation of the sense amplifier can be realized. This greatly reduces the impact of the imbalanced voltage produced by the mismatch of transistors, on the reading of data on the bit line, thereby improving the performance of semiconductor memories.

It should be understood that the aforementioned general description and the following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort. In the drawings.

DETAILED DESCRIPTION OF THE PRESENT INVENTION

Figure 1:
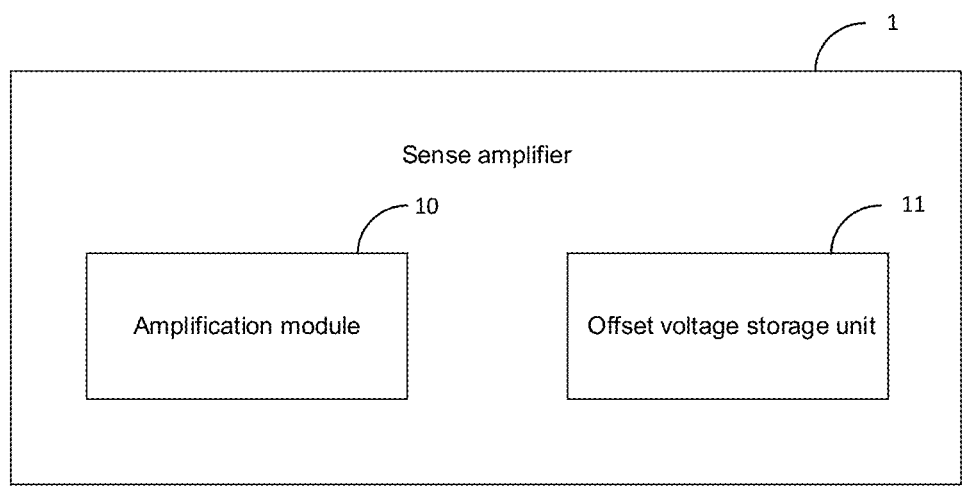
FIG. 1 schematically shows a block diagram of a sense amplifier according to an exemplary implementation of the present disclosure.

Exemplary implementations will now be described more fully with reference to the accompanying drawings. However, the exemplary implementations may be implemented in various forms, and should not be construed as being limited to the examples set forth herein; instead, these implementations are provided to make the present disclosure more comprehensive and complete, and to fully convey the concepts of the exemplary implementations to those skilled in the art. The described features, structures or characteristics may be combined in one or more implementations in any suitable way. In the following description, many specific details are provided to give a sufficient understanding of the implementations of the present disclosure. However, it will be realized by those skilled in the art that the technical solutions of the present disclosure may be practiced without one or more of the specific details, or other methods, components, apparatuses, steps, etc. may be used. In other cases, the well-known technical solutions will not be shown or described in detail in order to avoid obscuring the aspects of the present disclosure.

In addition, the drawings are merely schematic illustrations of the present disclosure, and are not necessarily drawn to scale. The same reference numerals in the figures denote the same or similar parts, and thus the repeated description thereof will be omitted. Terms "first", "second", "third", "fourth", "fifth", "sixth" and "seventh" are merely used for distinction and should not be considered as any limitation to the present disclosure.

It should be noted that the term "connection", as used herein, may include direct connection and indirect connection. In direct connection, there are no components between terminals. For example, the connection of the first terminal of a switch A to the first terminal of a switch B may mean that there is only a connecting wire (e.g., metal wire) between the first terminal of the switch A and the first terminal of the switch B, without any other components. In indirect connection, there may be other components between the terminals. For example, the connection of the first terminal of a switch C to the first terminal of a switch D may mean that there is at least one other component (for example, a switch E, etc.) on the connection line between the first terminal of the switch C and the first terminal of the switch D, in addition to the connecting wire.

In addition, in the following description, it may be understood by those skilled in the art that the term "offset" has the same meaning as the term "imbalance", and both indicate deviations due to the difference in transistors.

In the sense amplifier, due to the difference in the manufacturing process and the influence of the working environment, there may be difference in size, mobility, threshold voltage, etc., of the transistors. Usually the performance of transistors cannot be the same completely, which will cause the imbalance of the sense amplifier. As a result, imbalanced noise appears and seriously affects the correctness in reading data from the memories.

For example, the sense amplifier comprises two symmetrically configured NMOS transistors. Ideally, the performance of the two NMOS transistors is expected to be exactly the same. However, in practice, the threshold voltages of the two NMOS transistors may be different, which will cause the imbalance of the circuit. If nothing is done, when reading data from the storage unit, it is possible to read the originally stored "1" as "0", or read the originally stored "0" as "1", both resulting in error outputs.

To solve this problem, in some technologies, an offset-cancellation sense amplifier (OCSA) is provided to improve the sensing margin through offset cancellation. The reading speed is slow since this solution requires a special offset compensation stage before reading the data. In addition, such a sense amplifier is adjusted by the capacitance of the bit line, which is usually high, resulting in high power consumption during the adjustment.

In view of this, the present disclosure provides a novel sense amplifier.

FIG. 1 schematically shows a block diagram of a sense amplifier according to an exemplary implementation of the present disclosure. As shown in FIG. 1, the sense amplifier 1 may comprise an amplification module 10 and an offset voltage storage unit 11.

The amplification module 10 is configured to read data in a storage unit on a first bit line or a storage unit on a second bit line; and the offset voltage storage unit 11 is electrically connected to the amplification module 10.

In an offset cancellation stage of the sense amplifier, the sense amplifier 1 is configured to comprise a current mirror structure to store an offset voltage of the amplification module 10 in the offset voltage storage unit 11.

It should be noted that the offset voltage of the amplification module 10 may refer to the offset voltage between the components included in the amplification module 10. In other words, the offset voltage of the amplification module 10 may represent a voltage difference caused by the inconsistency between at least two components in the amplification module 10. In the case of integrating the voltage difference between all components, the offset voltage refers to the offset voltage of the entire amplification module 10.

The amplification module 10 may comprise a first PMOS transistor (hereinafter referred to as transistor P1), a second PMOS transistor (hereinafter referred to as transistor P2), a first NMOS transistor (hereinafter referred to as transistor N1), and a second NMOS transistor (hereinafter referred to as transistor N2).

In some embodiments of the present disclosure, the offset voltage storage unit may be configured as a capacitor. However, devices and units with a voltage storage function may be used as the offset voltage storage unit described in the present disclosure, and the configuration of the offset voltage storage unit will not be limited in the present disclosure.

Figure 2:
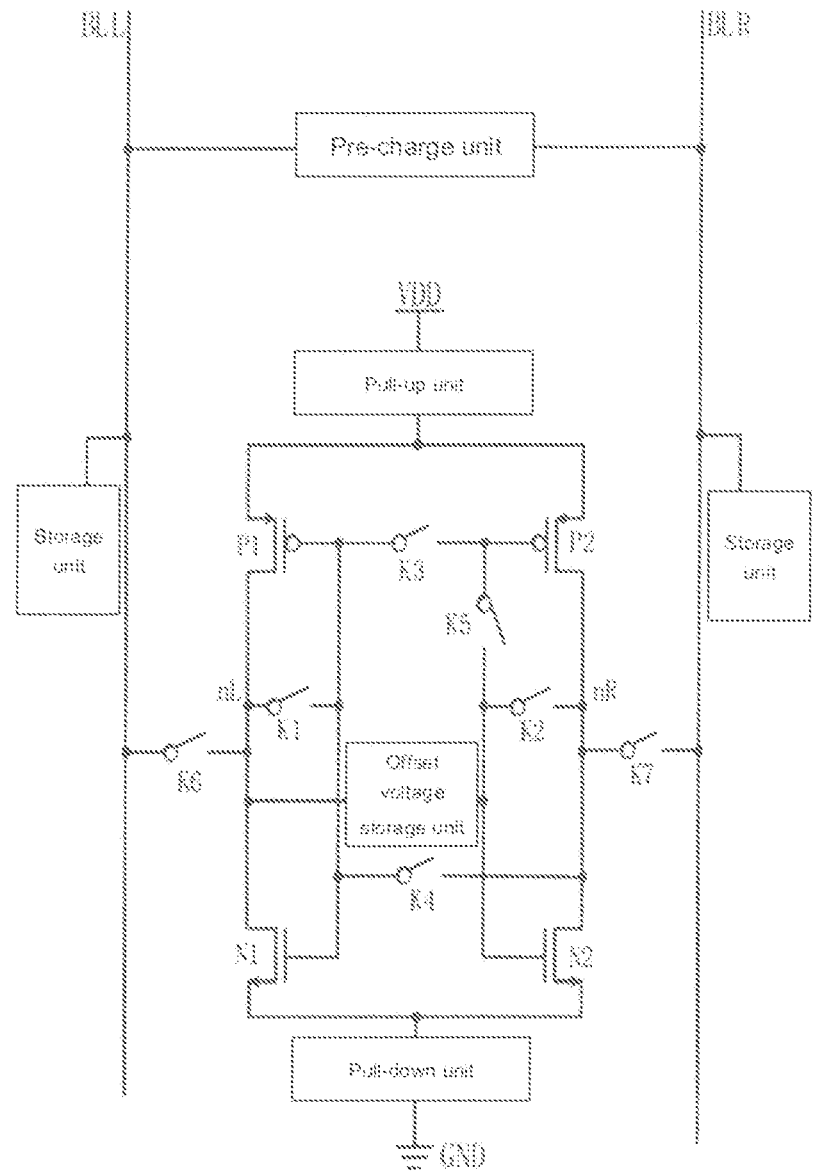
FIG. 2 schematically shows a circuit diagram of a sense amplifier according to an exemplary implementation of the present disclosure.

FIG. 2 schematically shows a circuit diagram of a sense amplifier according to an exemplary implementation of the present disclosure.

Referring to FIG. 2, a source of the transistor P1 is connected to a source of the transistor P2, a drain of the transistor P1 is connected to a drain of the transistor N1, and a gate of the transistor P1 is connected to a gate of the transistor N1. For the convenience of the subsequent description, a first node nL may be defined in the sense amplifier, and the drain of the transistor P1 is connected to the drain of the transistor N1 at the first node nL.

A drain of the transistor N2 is connected to a drain of the transistor P2, and a source of the transistor N2 is connected to a source of the transistor N1. For the convenience of the subsequent description, a second node nR may be defined in the sense amplifier, and the drain of the transistor N2 is connected to the drain of the transistor P2 at the second node nR.

A first terminal of the offset voltage storage unit is connected to the drain of the transistor N1, that is, connected to the first node nL. A second terminal of the offset voltage storage unit is connected to the gate of the transistor N2.

The working stage of the sense amplifier according to an exemplary implementation of the present disclosure may be divided into an offset cancellation stage, a voltage sensing stage, and a voltage difference amplification stage.

In the offset cancellation stage, the sense amplifier may store, in the offset voltage storage unit, the offset voltages of at least two transistors among the transistor N1, the transistor N2, the transistor P1, and the transistor P2. The offset voltage is due to the differences in size, mobility, threshold voltage, etc., of the transistors. In the voltage difference amplification stage, the sense amplifier may suppress the influence of the performance imbalance of the transistors on data amplification according to the offset voltage stored in the offset voltage storage unit, so that data on a bit line can be accurately read.

For the offset cancellation stage of the sense amplifier, the transistor P1 and the transistor P2 may be configured as a current mirror, and the transistor N1 and the transistor N2 may be configured by using diode connection mode, to store the offset voltage of the amplification module in the offset voltage storage unit.

It should be noted that the offset voltage of the amplification module refers to the offset voltage of at least two transistors (or components) in the amplification module. Specifically, it may be the offset voltage of the transistor P1 and the transistor P2, or the offset voltage of the transistor N1 and the transistor N2, or the combination of the above two offset voltages, which will not be limited in the present disclosure.

Referring to FIG. 2, the sense amplifier further comprises a first switch (hereinafter referred to as switch K1), a second switch (hereinafter referred to as switch K2), and a third switch (hereinafter referred to as switch K3) to realize the configuration of the transistors N1, N2, P1 and P2 of the sense amplifier in the offset cancellation stage.

A first terminal of the switch K1 is connected to the first node nL, and a second terminal of the switch K1 is connected to the gate of the transistor N1; a first terminal of the switch K2 is connected to the second node nR, and a second terminal of the switch K2 is connected to the gate of the transistor N2; and, a first terminal of the switch K3 is connected to the gate of the transistor P1, and a second terminal of the switch K3 is connected to the gate of the transistor P2.

In the offset cancellation stage of the sense amplifier, the switch K1, the switch K2, and the switch K3 are all in a closed state.

The type of the switch K1, the switchK2 and the switchK3 will not be limited in the present disclosure. For example, the switch K1 may be a PMOS transistor, an NMOS transistor or a CMOS transmission gate; the switch K2 may be a PMOS transistor, an NMOS transistor or a CMOS transmission gate; and the switch K3 may be a PMOS transistor, an NMOS transistor or a CMOS transmission gate.

In some embodiments of the present disclosure, the switch K1 may comprise a control terminal configured to control an on-off state of the switch K1 in response to a first control signal; the switch K2 may also comprise a control terminal configured to control an on-off state of the switch K2 in response to a second control signal; the switch K3 may also comprise a control terminal configured to control an on-off state of the switch K3 in response to the second control signal. In other words, the control terminals of the switch K2 and the switch K3 may both receive the second control signal.

The sense amplifier according to an exemplary implementation of the present disclosure further comprises a pull-up unit and a pull-down unit. The pull-up unit is configured to connect the source of the transistor P1 to the power supply voltage VDD in response to a pull-up control signal. The pull-down unit is configured to ground the source of the transistor N1 in response to a pull-down control signal.

In an embodiment of the present disclosure, the pull-up unit may comprise a pull-up PMOS transistor, and the pull-down unit may comprise a pull-down NMOS transistor. However, the pull-up unit may be implemented by an NMOS transistor and the pull-down unit may be implemented by a PMOS transistor; and the pull-up unit or the pull-down unit may comprise more than one device, and may comprise multiple devices that are controlled to be turned on or off by different control signals. This will not be limited in the present disclosure.

Also referring to FIG. 2, the sense amplifier of the present disclosure may further comprise a fourth switch (hereinafter referred to as switch K4) and a fifth switch (hereinafter referred to as switch K5).

A first terminal of the switch K4 is connected to the gate of the transistor N1, and a second terminal of the switch K4 is connected to the second node nR; and, a first terminal of the switch K5 is connected to the gate of the transistor P2, and a second terminal of the switch K5 is connected to the gate of the transistor N2.

Similarly, the type of the switch K4 and the switchK5 will not be limited in the present disclosure. For example, the switch K4 may be a PMOS transistor, an NMOS transistor or a CMOS transmission gate; and the switch K5 may be a PMOS transistor, an NMOS transistor or a CMOS transmission gate.

In some embodiments of the present disclosure, the switch K4 may comprise a control terminal configured to control an on-off state of the switch K4 in response to a third control signal; and the switch K5 may also comprise a control terminal configured to control an on-off state of the switch K5 in response to the third control signal status. In other words, the control terminals of the switch K4 and the switch K5 may both receive the third control signal.

In the offset cancellation stage of the sense amplifier, the switch K4 and the switch K5 are both in an open state.

In addition, the sense amplifier of the present disclosure may further comprise a sixth switch (hereinafter referred to as switch K6) and a seventh switch (hereinafter referred to as switch K7).

A first terminal of the switch K6 is connected to the first bit line (denoted by BLL), and a second terminal of the switch K6 is connected to the first node nL; and, a first terminal of the switch K7 is connected to the second bit line (denoted by BLR), and a second terminal of the switch K7 is connected to the second node nR. It is easily understood by those skilled in the art that there are corresponding storage units on the first bit line BLL and on the second bit line BLR, respectively.

Similarly, the type of the switch K6 and the switchK7 will not be limited in the present disclosure. For example, the switch K6 may be a PMOS transistor, an NMOS transistor or a CMOS transmission gate; and the switch K7 may be a PMOS transistor, an NMOS transistor or a CMOS transmission gate.

In some embodiments of the present disclosure, the switch K6 may comprise a control terminal configured to control an on-off state of the switch K6 in response to a fourth control signal; and the switch K7 may also comprise a control terminal configured to control an on-off state of the switch K7 in response to the fourth control signal status. In other words, the control terminals of the switch K6 and the switch K7 may both receive the fourth control signal.

In the offset cancellation stage of the sense amplifier, the switch K6 and the switch K6 are both in an open state.

In combination with the above exemplary circuit configuration, in the offset cancellation stage of the sense amplifier, the offset voltage of the amplification module may be stored in the offset voltage storage unit.

In the voltage sensing stage after the offset cancellation stage of the sense amplifier, the storage unit corresponding to the first bit line BLL or the storage unit corresponding to the second bit line BLR is turned on, the switch K1 is open, the switch K2 and the switch K3 are open, the source of the transistor P1 and the source of the transistor P2 are disconnected from the power supply voltage, the source of the transistor N1 and the source of the transistor N2 are disconnected from the ground, the switch K4 and the switch K5 are closed, and the switch K6 and the switch K7 are closed, to input a voltage difference between the first bit line BLL and the second bit line BLR into the sense amplifier. Since the offset voltage between the transistor N1 and the transistor N2 is stored in the offset voltage storage unit, it is possible to avoid reading the erroneous data due to the inconsistency of the transistor N1 and the transistor N2.

It may be understood by those skilled in the art that turning on the storage unit means that the word line corresponding to the storage unit is activated so that data (0 or 1) stored in the storage unit is transmitted to the bit line.

In a case where the voltage difference between the first bit line BLL and the second bit line BLR is input to the sense amplifier, the source of the transistor P1 is connected to the power supply voltage, and the source of the transistor N1 is grounded, so that the sense amplifier amplifies the voltage difference.

In addition, still referring to FIG. 2, the sense amplifier according to an exemplary implementation of the present disclosure further comprises a pre-charge unit configured to pre-charge the first bit line BLL and the second bit line BLR when the sense amplifier is in a pre-charge stage.

As described above, with the structure of the sense amplifier according to an exemplary implementation of the present disclosure, since the switch K6 and the switch K7 are both in the open state in the offset cancellation stage, the operation of storing the offset voltage between the transistor N1 and the transistor N2 in the offset voltage storage unit will not be affected while pre-charging the first bit line BLL and the second bit line BLR. Therefore, in the exemplary implementation of the present disclosure, the pre-charge stage and the aforementioned offset cancellation stage may be configured to be executed simultaneously.

Figure 3:
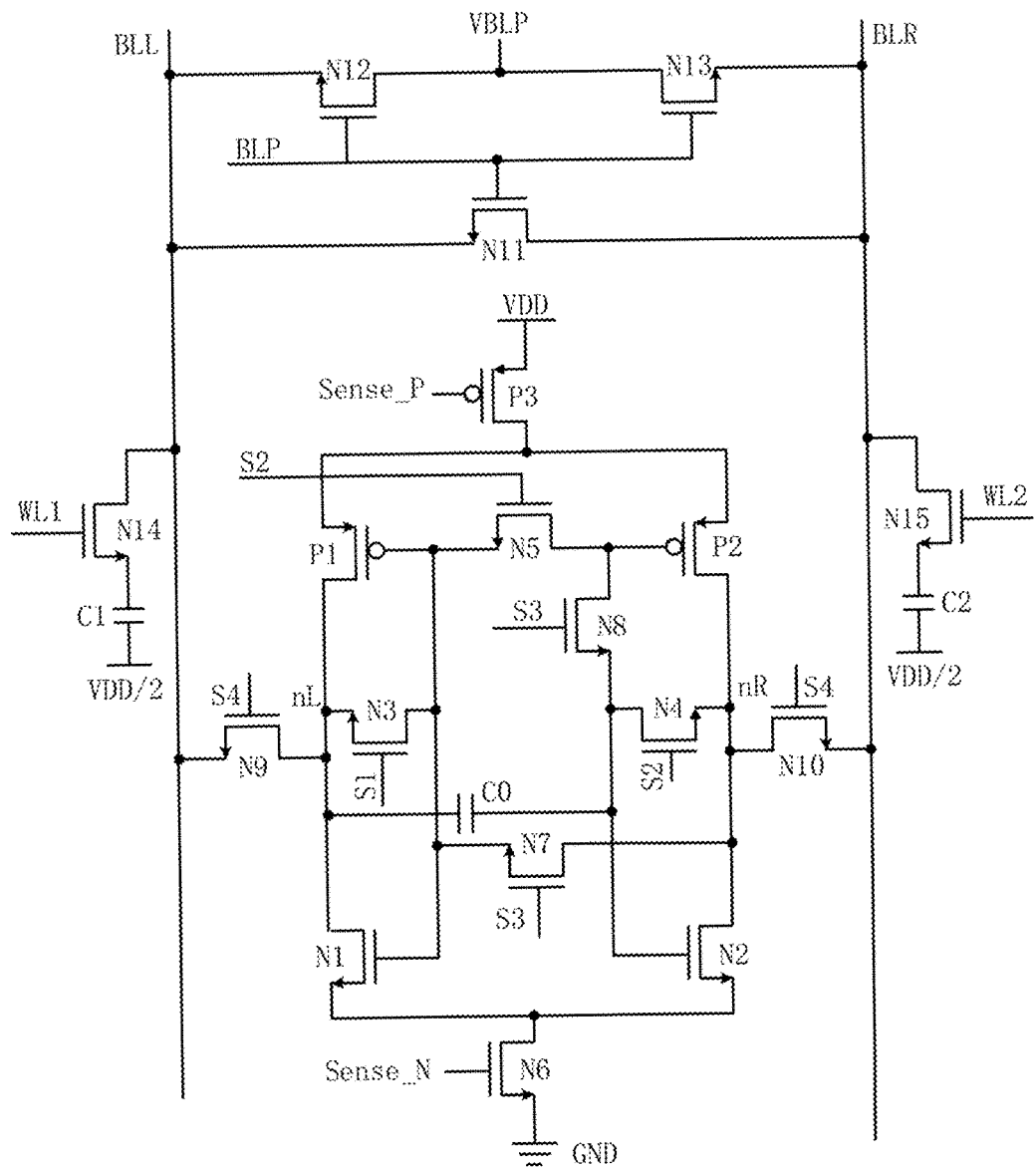
FIG. 3 schematically shows a circuit diagram of a specific configuration of a sense amplifier according to an embodiment of the present disclosure.

FIG. 3 schematically shows a circuit diagram of a sense amplifier according to an embodiment of the present disclosure.

In the embodiment shown in FIG. 3, the offset voltage storage unit is configured as a capacitor C0.

The switch K1 is configured as a transistor N3, the on-off state of which is controlled in response to the first control signal S1; the switch K2 is configured as a transistor N4, the on-off state of which is controlled in response to the second control signal S2; the switch K3 is configured as a transistor N5, the on-off state of which is controlled in response to the second control signal S2.

The pull-up unit is configured as a transistor P3, the on-off state of which is controlled in response to the pull-up control signal Sense_P; and the pull-down unit is configured as a transistor N6, the on-off state of which is controlled in response to the pull-down control signal Sense_N.

The switch K4 is configured as a transistor N7, the on-off state of which is controlled in response to the third control signal S3; and the switch K5 is configured as a transistor N8, the on-off state of which is controlled in response to the third control signal S3.

The switch K6 is configured as a transistor N9, the on-off state of which is controlled in response to the fourth control signal S4; and the switch K7 is configured as a transistor N10, the on-off state of which is controlled in response to the fourth control signal S4.

The pre-charge unit may comprise a transistor N11, a transistor N12, and a transistor N13. Gates of the transistor N11, the transistor N12, and the transistor N13 may all receive the pre-charge control signal BLP. A source of the transistor N11 is connected to the first bit line BLL, and a drain of the transistor N11 is connected to the second bit line BLR; a source of the transistor N12 is connected to the first bit line BLL, and a drain of the transistor N12 is connected to the pre-charge voltage VBLP, wherein the pre-charge voltage VBLP may be configured to be VDD/2; and a source of the transistor N13 is connected to the second bit line BLR, and a drain of the transistor N13 is connected to the pre-charge voltage VBLP.

The storage unit corresponding to the first bit line BLL is configured to comprise a transistor N14 and a capacitor C1, and the on-off state of the storage unit is controlled by the transistor N14 in response to a first word line control signal WL1; and the storage unit corresponding to the second bit line BLR is configured to comprise a transistor N15 and a capacitor C2, and the on-off state of the storage unit is controlled by the transistor N15 in response to a second word line control signal WL2.

Figure 4:
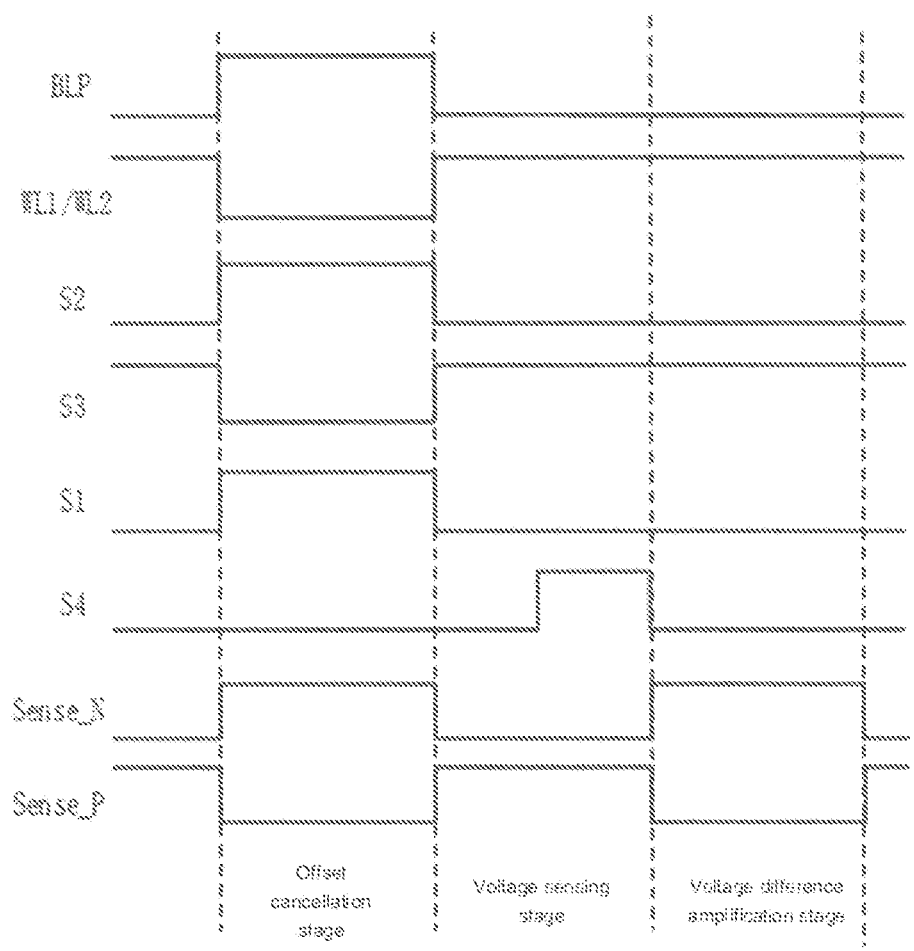
FIG. 4 schematically shows a timing diagram of various control signals involved in a sense amplifier according to an embodiment of the present disclosure.

FIG. 4 schematically shows a timing diagram of various control signals according to an embodiment of the present disclosure.

In combination with the timing diagram of FIG. 4, the working stages of the sense amplifier according to some embodiments of the present disclosure will be described with reference to FIG. 5, FIG. 6 and FIG. 7, respectively.

Figure 5:
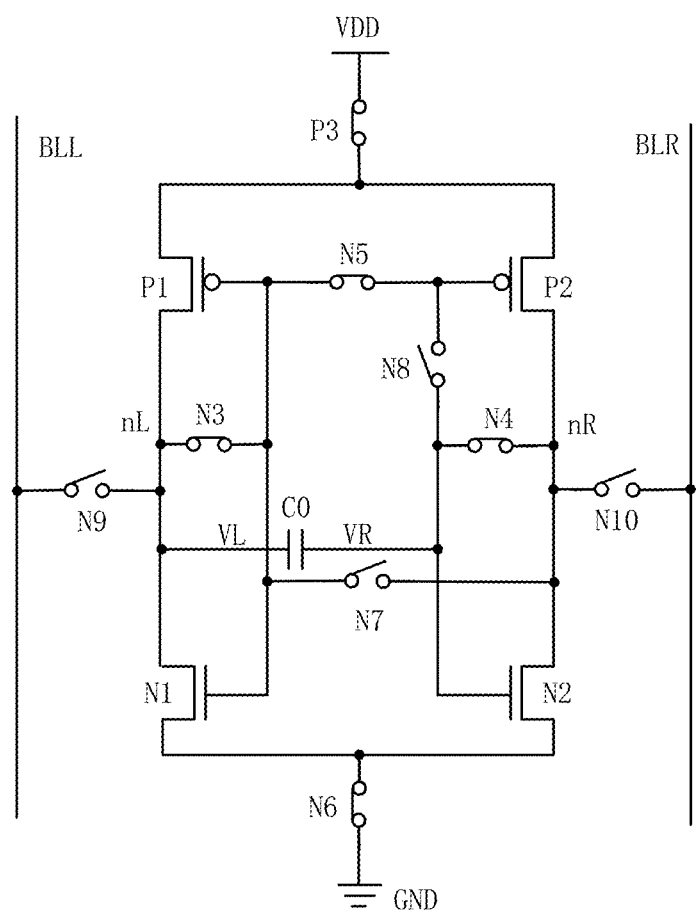
FIG. 5 schematically shows a circuit diagram of a sense amplifier in an offset cancellation stage according to an embodiment of the present disclosure.

FIG. 5 shows the offset cancellation stage of the sense amplifier. The first control signal S1 is at a high level and the transistor N3 is turned on (corresponding to the closed state of the switch); the second control signal S2 is at a high level, and the transistor N4 and the transistor N5 are turned on; the third control signal S3 is at a low level, and the transistor N7 and the transistor N8 are turned off (corresponding to the open state of the switch); and the fourth control signal S4 is at a low level, the transistor N9 and the transistor N10 are turned off.

The pull-up control signal Sense_P is at low a level, and the transistor P3 is turned on; and the pull-down control signal Sense_N is at high a level, and the transistor N6 is turned on.

Thus, the transistor P1 and the transistor P2 are configured as a current mirror, and the transistor N1 and the transistor N2 are both configured by using diode connection mode. In this case, the offset voltage between the transistor N1 and the transistor N2 will be stored in the capacitor C0. The voltage on a side of the capacitor C0 which is close to the first bit line BLL may be denoted by $V_L$, and the voltage on a side of the capacitor C0 which is close to the second bit line BLR may be denoted by VR.

In addition, in the offset cancellation stage, the word lines WL1/WL2 are at a low level, and the corresponding transistors are in a turned-off state. In other words, there is no data to be read on the bit line.

The pre-charge control signal BLP is at a high level, that is, pre-charge is performed, and the first bit line BLL and the second bit line BLR are both pre-charged to the pre-charge voltage VBLP.

Figure 6:
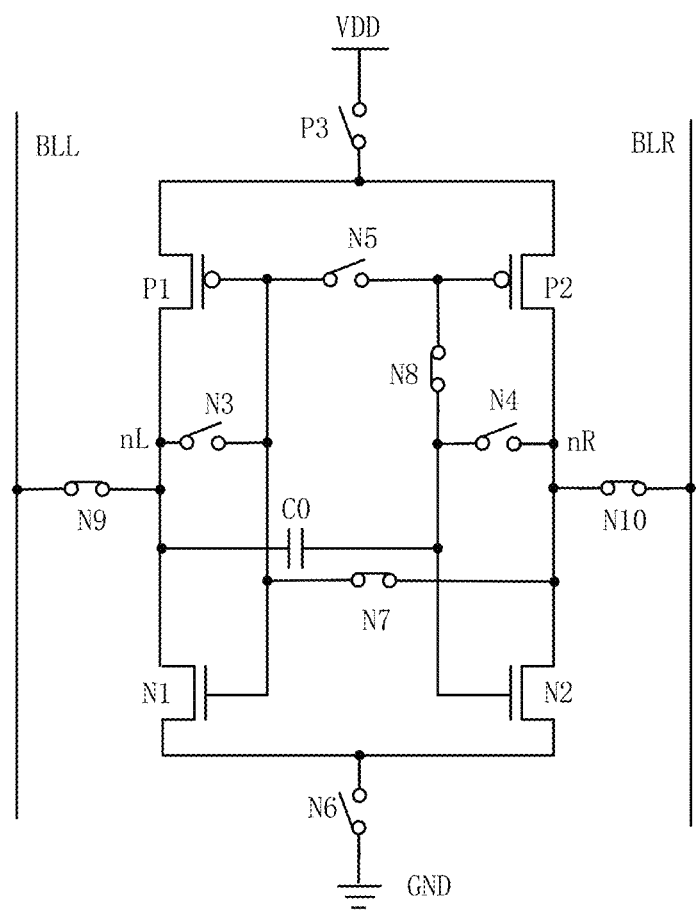
FIG. 6 schematically shows a circuit diagram of a sense amplifier in a voltage sensing stage according to an embodiment of the present disclosure.

FIG. 6 shows the voltage sensing stage of the sense amplifier. The first control signal S1 is at a low level and the transistor N3 is turned off; the second control signal S2 is at a low level and the transistor N4 and the transistor N5 are turned off; the third control signal S3 is at a high level, and the transistor N7 and the transistor N8 are turned on; and the fourth control signal S4 is continuously at a low level and then jumps to a high level, the transistor N9 and the transistor N10 are first in the turned-off state and then turned on.

The pull-up control signal Sense_P is at a high level and the transistor P3 is turned off; and the pull-down control signal Sense_N is at a low level and the transistor N6 is turned off.

In addition, the pre-charge control signal BLP is at a low level and the pre-charge has terminated.

First, the word lines WL1/WL2 are at a high level, the corresponding transistors are turned on, and the data stored in the capacitor is transferred to the bit line. For example, the second word line control signal WL2 is at a high level, the transistor N15 is turned on, and the data stored in the capacitor C2 is transferred to the second bit line BLR. Due to the influence of data on the bit line, a small voltage difference is formed between the first bit line BLL and the second bit line BLR.

Next, the fourth control signal S4 jumps to a high level, and the transistor N9 and the transistor N10 are turned on, so that this small voltage difference is transmitted to the inside of the sense amplifier. Due to the capacitor C0, the voltage actually transmitted to the gate of the transistor N2 is $V_{BLL}+VR-V_L$, wherein $V_{BLL}$ is the voltage on the first bit line. Thus, the voltage difference caused by the inconsistency of at least two transistors in the amplification module is prevented from being erroneously amplified, and the reading error rate is reduced.

Figure 7:
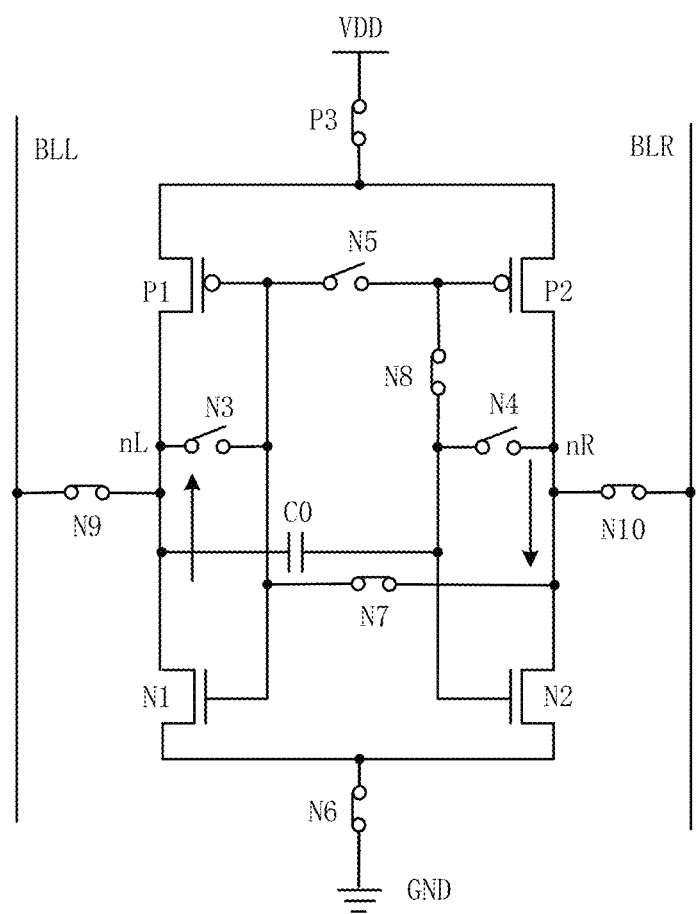
FIG. 7 schematically shows an equivalent circuit diagram of a sense amplifier in a voltage difference amplification stage according to an embodiment of the present disclosure.

FIG. 7 shows the voltage difference amplification stage of the sense amplifier. With reference to the timing diagram of FIG. 4, compared with the voltage sensing stage, the pull-up control signal Sense_P is at a low level and the transistor P3 is turned on; and the pull-down control signal Sense_N is at a high level and the transistor N6 is turned on.

In this case, the transistor P1, the transistor P2, the transistor N1, and the transistor N2 form two cross-coupled inverter positive feedback circuits, so that the voltage difference on the bit line can be quickly amplified and then written back to the corresponding storage unit.

By the configuration of the sense amplifier according to an exemplary implementation of the present disclosure, the offset compensation of the sense amplifier can be realized. This greatly reduces the influence of the imbalanced voltage, which is caused by the mismatch of the transistors, on the reading of data on the bit line, thereby improving the performance of semiconductor memories.

In addition, in other embodiments of the present disclosure, between the offset cancellation stage and the voltage sensing stage of the sense amplifier, there may be a voltage balancing stage, so that the voltage of the first node nL is consistent with the voltage of the second node nR.

Figure 8:
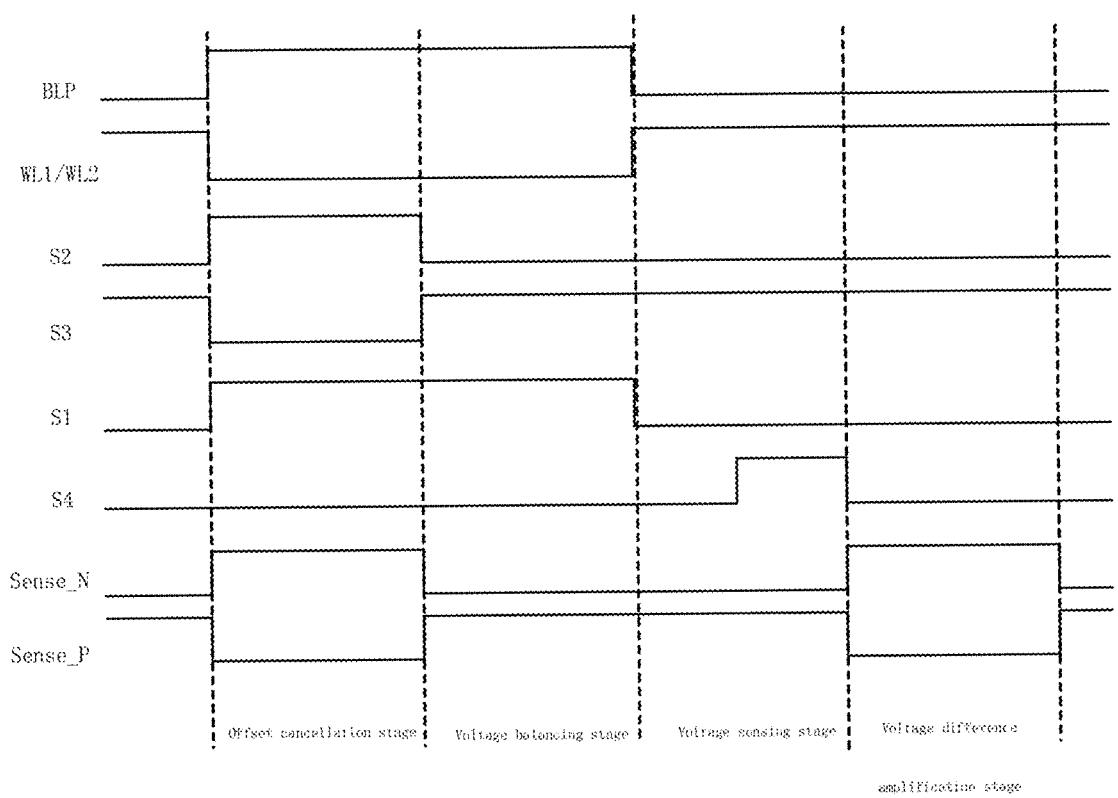
FIG. 8 schematically shows a timing diagram of various control signals involved in a sense amplifier according to another embodiment of the present disclosure.

FIG. 8 shows a timing diagram of various control signals in these stages, comprising the voltage balancing stage.

Figure 9:
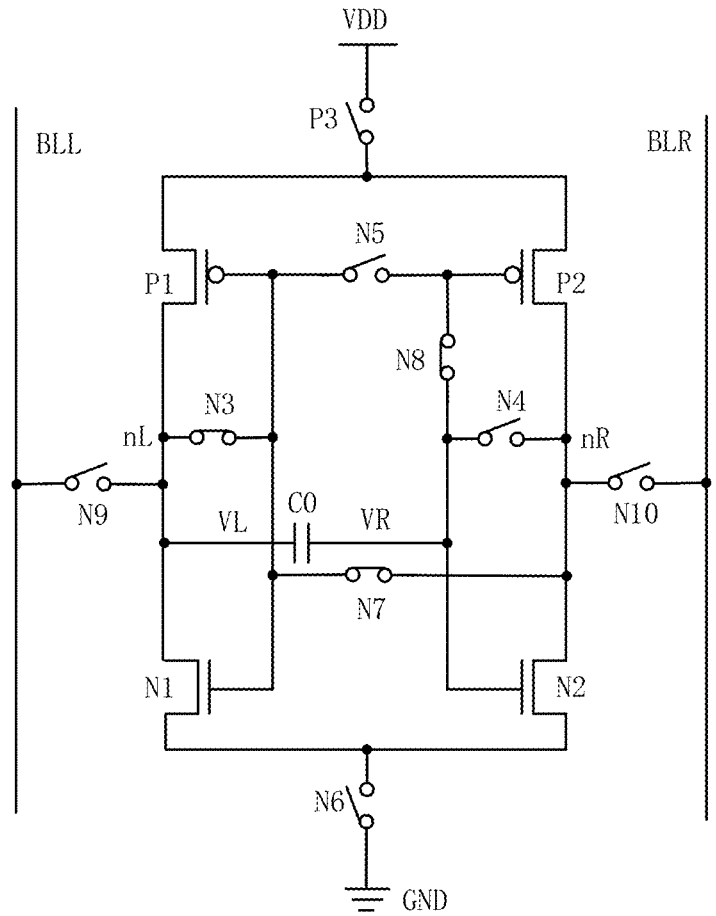
FIG. 9 schematically shows a circuit diagram of a sense amplifier in a voltage balancing stage according to an embodiment of the present disclosure.

In combination with the timing diagram of FIG. 8, the voltage balancing stage in other embodiments of the present disclosure will be described with reference to FIG. 9.

Compared with the offset cancellation stage, in the voltage balancing stage of the sense amplifier, the second control signal S2 is at a low level, and the transistor N4 and the transistor N5 are turned off; and the third control signal S3 is at a high level, and the transistor N7 and the transistor N8 are turned on.

The pull-up control signal Sense_P is at a high level and the transistor P3 is turned off; and the pull-down control signal Sense_N is at a low level and the transistor N6 is turned off.

Thus, the voltage of the first node nL is consistent with the voltage of the second node nR in the sense amplifier, thereby achieving the purpose of charge balancing, and eliminating the influence of the voltage difference formed during the offset cancellation stage on the data reading.

In an embodiment that involves a voltage balancing stage, the pre-charge stage may be executed when the offset cancellation stage is executed, or the pre-charge stage may be executed when the voltage balancing stage is executed, or the pre-charge stage may be executed when the offset cancellation stage and the voltage balancing stage are executed.

Further, the present disclosure provides a method for controlling a sense amplifier.

Figure 10:
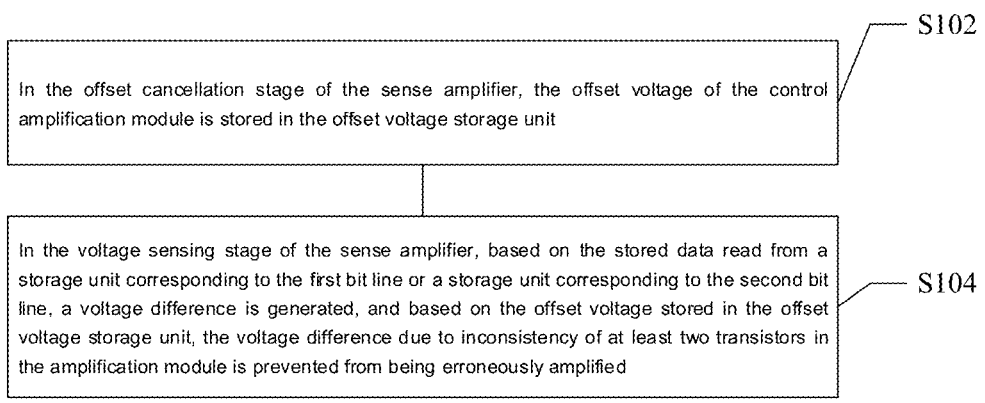
FIG. 10 schematically shows a flowchart of a method for controlling a sense amplifier according to an exemplary implementation of the present disclosure.

FIG. 10 schematically shows a flowchart of a method for controlling a sense amplifier according to an exemplary implementation of the present disclosure. As described above, the sense amplifier may comprise a first NMOS transistor, a second NMOS transistor, and an offset voltage storage unit.

Referring to FIG. 10, the method for controlling a sense amplifier may comprise the following steps:

S102. In the offset cancellation stage of the sense amplifier, the offset voltage of the amplification module is controlled to be stored in the offset voltage storage unit.

S104. In the voltage sensing stage of the sense amplifier, based on the stored data read from the storage unit corresponding to the first bit line or the storage unit corresponding to the second bit line, a voltage difference is generated, and based on the offset voltage stored in the offset voltage storage unit, the voltage difference due to inconsistency of at least two transistors in the amplification module is prevented from being erroneously amplified.

As described above, the sense amplifier may further involve a voltage difference amplification stage to amplify the voltage difference on the bit line and write the voltage back to the storage unit. In addition, in other embodiments, the sense amplifier may further involve a voltage balancing stage. These details have been explained in the above description with reference to the sense amplifier, and will not be repeated here.

With the method for controlling a sense amplifier according to an exemplary implementation of the present disclosure, the offset compensation of the sense amplifier can be realized by using the offset voltage stored in the offset voltage storage unit. This greatly reduces the influence of the imbalanced voltage, which is caused by the mismatch of the transistors, on the reading of data on the bit line, thereby improving the performance of semiconductor memories.

Figure 11:
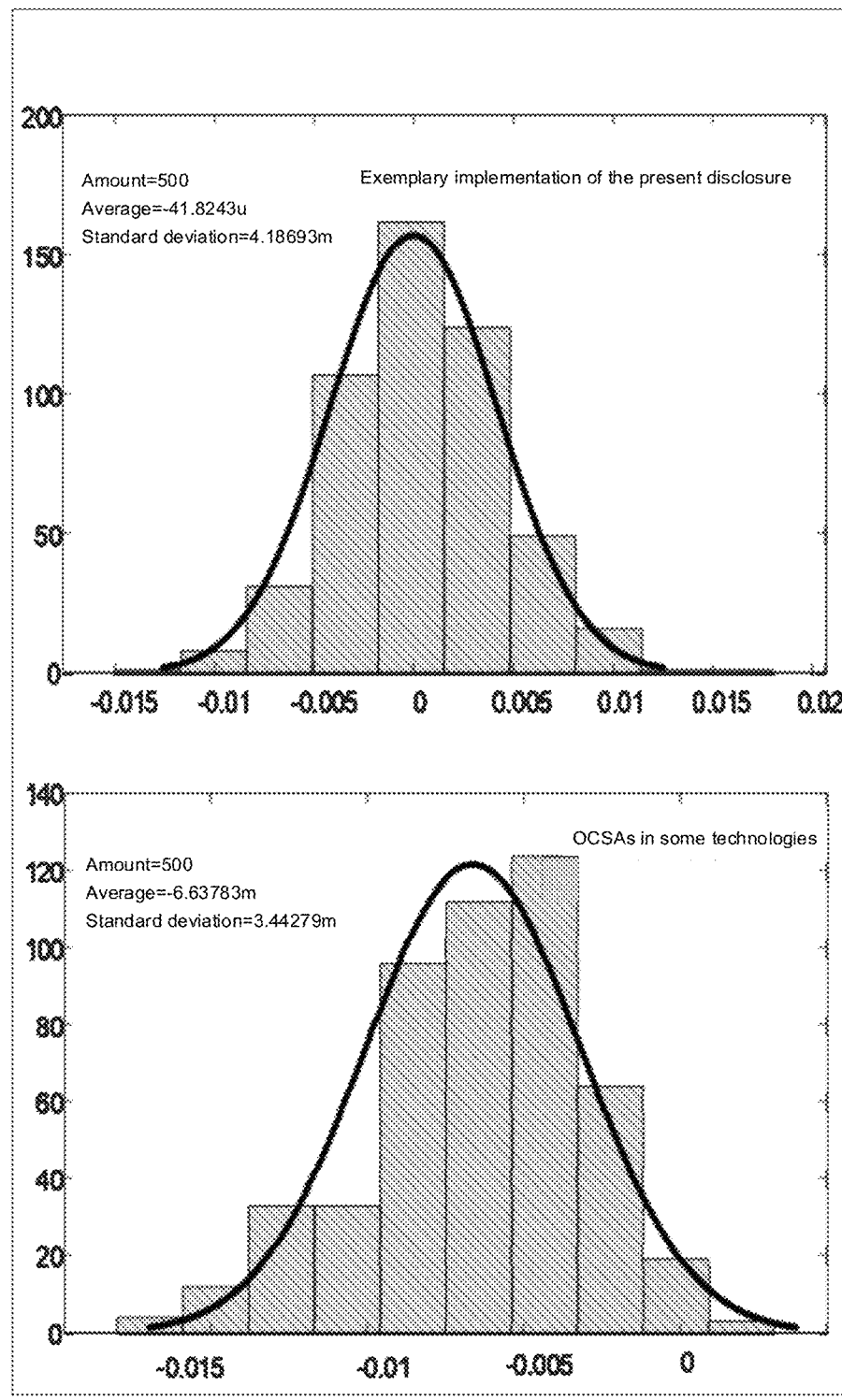
FIG. 11 is a diagram showing the comparison of imbalanced voltage simulation result between a sense amplifier according to an exemplary implementation of the present disclosure and a sense amplifier in some technologies.

FIG. 11 is a diagram showing the comparison of imbalanced voltage simulation result between a sense amplifier according to an exemplary implementation of the present disclosure and a sense amplifier in some technologies.

As shown in FIG. 11, compared with the OCSAs in some technologies, the standard deviation of the imbalanced voltage of the sense amplifier according to an exemplary implementation of the present disclosure is increased from 3.44279 mV to 4.18693 mV, which is a small difference. However, the reading speed and the power consumption of the sense amplifier according to an exemplary implementation of the present disclosure can be greatly improved.

Figure 12:
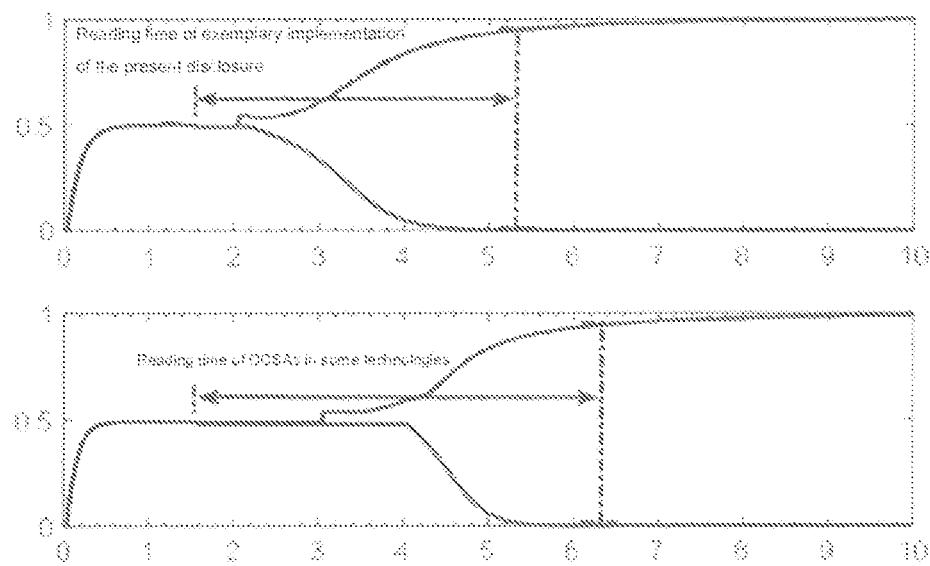
FIG. 12 is a diagram showing the comparison of reading time between a sense amplifier according to an exemplary implementation of the present disclosure and a sense amplifier in some technologies.

FIG. 12 is a diagram showing the comparison of reading time between a sense amplifier according to an exemplary implementation of the present disclosure and a sense amplifier in some technologies.

In an exemplary implementation of the present disclosure, the offset voltage may be stored in a capacitor, and the pre-charge stage of the sense amplifier may be performed at the same time as the offset cancellation stage. Therefore, compared with OCSAs in some technologies, the reading speed of the sense amplifier according to an exemplary implementation of the present disclosure is increased by 20.5%.

Figure 13:
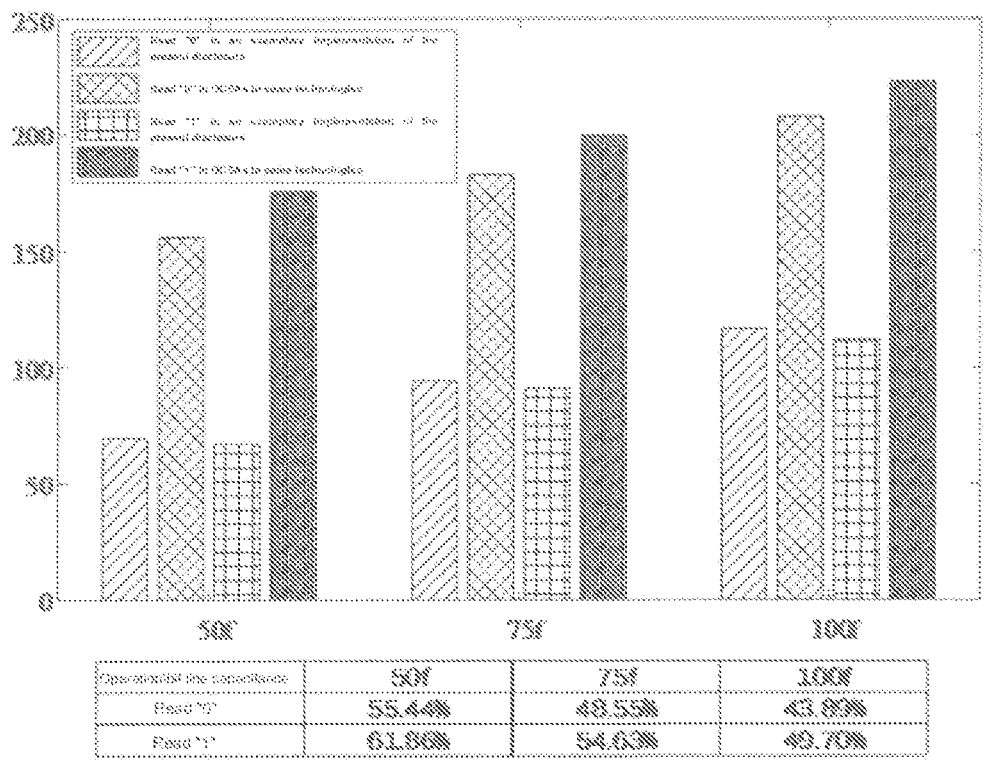
FIG. 13 is a diagram showing the comparison of average power consumption between a sense amplifier according to an exemplary implementation of the present disclosure and a sense amplifier in some technologies.

FIG. 13 is a diagram showing the comparison of average power consumption between a sense amplifier according to an exemplary implementation of the present disclosure and a sense amplifier in some technologies.

By experimental comparison, since the offset voltage is stored in a capacitor in an exemplary implementation of the present disclosure, a large amount of energy is saved. Compared with OCSAs in some technologies, the power consumption is reduced by 43% to 61%.

In conclusion, the sense amplifier according to an exemplary implementation of the present disclosure has a simple circuit structure. By means of storing the offset voltage in a capacitor, the reading speed is improved and the power consumption for reading is greatly reduced, while eliminating the offset, compared with some technologies.

Further, the present disclosure further provides a memory, comprising the sense amplifier described above.

With the sense amplifier according to an exemplary implementation of the present disclosure, the reading error rate of memories is reduced, the reading speed is improved, and the power consumption for reading is reduced. Thus, the performance of memories is greatly improved.

Those skilled in the art will readily think of other embodiments of the present disclosure by considering the specification and practicing the invention disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the claims.

It should be understood that the present disclosure is not limited to the precise structures that have been described above and shown in the drawings, and various modifications and changes may be made without departing from its scope. The scope of the present disclosure is defined only by the appended claims.

The invention claimed is:

1. A sense amplifier, comprising:
   an amplification module; and
   an offset voltage storage unit, electrically connected to the amplification module;
   wherein the amplification module comprises:
   a first p-channel metal-oxide semiconductor (PMOS) transistor;
   a second PMOS transistor, a source of the second PMOS transistor being connected to a source of the first PMOS transistor;
   a first n-channel metal-oxide semiconductor (NMOS) transistor, a drain of the first NMOS transistor being connected to a drain of the first PMOS transistor and a first terminal of the offset voltage storage unit, and a gate of the first NMOS transistor being connected to a gate of the first PMOS transistor; and
   a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second terminal of the offset voltage storage unit;
   wherein, in an offset cancellation stage of the sense amplifier, the first PMOS transistor and the second PMOS transistor are configured as a current mirror, and the first NMOS transistor and the second NMOS transistor are both configured by using a diode connection mode, to store an offset voltage of the amplification module in the offset voltage storage unit.

2. The sense amplifier according to claim 1, wherein the drain of the first PMOS transistor is connected to the drain of the first NMOS transistor at a first node, and the drain of the second PMOS transistor is connected to the drain of the second NMOS transistor at a second node; the sense amplifier further comprises:
   a first switch, a first terminal of the first switch being connected to the first node, and a second terminal of the first switch being connected to the gate of the first NMOS transistor;
   a second switch, a first terminal of the second switch being connected to the second node, and a second terminal of the second switch being connected to the gate of the second NMOS transistor; and
   a third switch, a first terminal of the third switch being connected to the gate of the first PMOS transistor, and a second terminal of the third switch being connected to a gate of the second PMOS transistor;
   wherein, in the offset cancellation stage of the sense amplifier, the first switch, the second switch and the third switch are all in a closed state.

3. The sense amplifier according to claim 2, wherein the sense amplifier further comprises:
   a pull-up unit, configured to control a connection state between the source of the first PMOS transistor and a power supply voltage in response to a pull-up control signal; and a pull-down unit, configured to control the source of the first NMOS transistor to be connected to a ground or disconnected from the ground in response to a pull-down control signal;

wherein, in the offset cancellation stage of the sense amplifier, the source of the first PMOS transistor is connected to the power supply voltage, and the source of the first NMOS transistor is connected to the ground.

4. The sense amplifier according to claim 2, wherein the first switch further comprises a control terminal configured to control an on-off state of the first switch in response to a first control signal;

the second switch further comprises a control terminal configured to control an on-off state of the second switch in response to a second control signal; and the third switch further comprises a control terminal configured to control an on-off state of the third switch in response to the second control signal.

5. The sense amplifier according to claim 3, wherein the sense amplifier further comprises:

a fourth switch, a first terminal of the fourth switch being connected to the gate of the first NMOS transistor, and a second terminal of the fourth switch being connected to the second node; and a fifth switch, a first terminal of the fifth switch being connected to the gate of the second PMOS transistor, and a second terminal of the fifth switch being connected to the gate of the second NMOS transistor;

wherein, in the offset cancellation stage of the sense amplifier, the fourth switch and the fifth switch are both open.

6. The sense amplifier according to claim 5, wherein the fourth switch further comprises a control terminal configured to control an on-off state of the fourth switch in response to a third control signal; and the fifth switch further comprises a control terminal configured to control an on-off state of the fifth switch in response to the third control signal.

7. The sense amplifier according to claim 6, wherein the sense amplifier further comprises:

a sixth switch, a first terminal of the sixth switch being connected to a first bit line, and a second terminal of the sixth switch being connected to the first node; and a seventh switch, a first terminal of the seventh switch being connected to a second bit line, and a second terminal of the seventh switch being connected to the second node;

wherein, in the offset cancellation stage of the sense amplifier, the sixth switch and the seventh switch are both open.

8. The sense amplifier according to claim 7, wherein the sixth switch further comprises a control terminal configured to control an on-off state of the sixth switch in response to a fourth control signal; and the seventh switch further comprises a control terminal configured to control an on-off state of the seventh switch in response to the fourth control signal.

9. The sense amplifier according to claim 8, wherein, after the offset cancellation stage of the sense amplifier, a storage unit corresponding to the first bit line or a storage unit corresponding to the second bit line is turned on, the first switch is open, the second switch and the third switch are open, the source of the first PMOS transistor is disconnected from the power supply voltage, the source of the first NMOS transistor is disconnected from the ground, the fourth switch and the fifth switch are closed, and the sixth switch and the seventh switch are closed to input a voltage difference between the first bit line and the second bit line into the sense amplifier.

10. The sense amplifier according to claim 9, wherein, in a case where the voltage difference between the first bit line and the second bit line is input to the sense amplifier, the source of the first PMOS transistor is connected to the power supply voltage, and the source of the first NMOS transistor is connected to the ground, to amplify the voltage difference.

11. The sense amplifier according to claim 7, wherein the sense amplifier further comprises:

a pre-charge unit, configured to pre-charge the first bit line and the second bit line when the sense amplifier is in a pre-charge stage.

12. The sense amplifier according to claim 11, wherein the pre-charge stage and the offset cancellation stage are configured to be executed simultaneously.

13. A memory, comprising the sense amplifier according to claim 1.

14. A method for controlling a sense amplifier, wherein the sense amplifier comprises an amplification module and an offset voltage storage unit;

wherein the amplification module comprises:
a first p-channel metal-oxide semiconductor (PMOS) transistor;
a second PMOS transistor, a source of the second PMOS transistor being connected to a source of the first PMOS transistor;
a first n-channel metal-oxide semiconductor (NMOS) transistor, a drain of the first NMOS transistor being connected to a drain of the first PMOS transistor and a first terminal of the offset voltage storage unit, and a gate of the first NMOS transistor being connected to a gate of the first PMOS transistor; and
a second NMOS transistor, a drain of the second NMOS transistor being connected to a drain of the second PMOS transistor, a source of the second NMOS transistor being connected to a source of the first NMOS transistor, and a gate of the second NMOS transistor being connected to a second terminal of the offset voltage storage unit;

wherein the method comprises:
in an offset cancellation stage of the sense amplifier, configuring the first PMOS transistor and the second PMOS transistor as a current mirror, and configuring both the first NMOS transistor and the second NMOS transistor by using a diode connection mode, to store an offset voltage of the amplification module in the offset voltage storage unit, to realize offset compensation.

15. The method for controlling a sense amplifier according to claim 14, further comprising:

in a voltage sensing stage of the sense amplifier, generating a voltage difference based on stored data read from a storage unit corresponding to a first bit line or a storage unit corresponding to a second bit line.

16. The method for controlling a sense amplifier according to claim 15, wherein a working stage of the sense amplifier further comprises a voltage difference amplification stage; wherein, the method for controlling a sense amplifier further comprises:

in the voltage difference amplification stage of the sense amplifier, amplifying the voltage difference, and based on the offset voltage stored in the offset voltage storage unit, preventing the voltage difference due to inconsistency of at least two transistors in the amplification module from being erroneously amplified.

17. The method for controlling a sense amplifier according to claim 16, wherein the working stage of the sense amplifier further comprises a pre-charge stage; wherein, the method for controlling a sense amplifier further comprises:
    in the pre-charge stage of the sense amplifier, pre-charging the first bit line and the second bit line.

18. The method for controlling a sense amplifier according to claim 17, further comprising:
    when the sense amplifier is in the offset cancellation stage, controlling a pre-charge operation in the pre-charge stage to be performed.

\* \* \* \* \*